United States Patent [19]

Hagimura et al.

[11] Patent Number: 5,173,162

[45] Date of Patent: Dec. 22, 1992

[54] MULTI-LAYERED ELECTROSTRICTIVE EFFECT ELEMENT

[75] Inventors: Atsushi Hagimura, Kanagawa; Mutsuo Nakajima, Tokyo; Kunio Nishihara; Ikuo Inage, both of Kanagawa, all of Japan

[73] Assignee: Mitsui Toatsu Chemicals, Inc., Tokyo, Japan

[21] Appl. No.: 637,554

[22] Filed: Jan. 4, 1991

Related U.S. Application Data

[63] Continuation-in-part of Ser. No. 544,256, Jun. 26, 1990, abandoned.

[30] Foreign Application Priority Data

| Jul. 5, 1989 [JP] Japan | 1-171854 |
| Nov. 15, 1989 [JP] Japan | 1-294900 |
| Feb. 6, 1990 [JP] Japan | 2-25264 |

[51] Int. Cl.$^5$ .......................................... G01N 27/26
[52] U.S. Cl. ............................ 204/299 R; 204/180.2; 204/180.9; 204/181.6
[58] Field of Search ............... 204/180.2, 181.6, 180.9, 204/299 R

[56] References Cited

U.S. PATENT DOCUMENTS

| 3,616,389 | 10/1971 | Onishi | 204/181 |
| 3,892,647 | 7/1975 | Peterson | 204/181 |
| 4,618,667 | 7/1987 | Utsumi et al. | 204/15 |

FOREIGN PATENT DOCUMENTS

| 167392 | 1/1986 | European Pat. Off. | |
| 0008340 | 1/1976 | Japan | 204/180.2 |

OTHER PUBLICATIONS

Patent Abstracts of Japan, vol. 12, No. 30 (E-578), Jan. 1988.
Patent Abstracts of Japan, vol. 11, No. 277 (E-538), Sep. 1987.
Patent Abstracts of Japan, vol. 13, No. 277 (E-778), Jun. 1989.
Patent Abstracts of Japan, vol. 8, No. 235 (E-275), Oct. 1985.
H. S. Elias et al, "Neu Polymer Werkstofe Fuer Die Industrielle Anwendung", Munchen, Section 11.2.1, 1983, pp. 257–262.
A. Franck et al, "Kunststoff-Kompendium", Wurzburg, Section 4.6.3, 1984, pp. 186–189.

Primary Examiner—John Niebling
Assistant Examiner—David G. Ryser
Attorney, Agent, or Firm—Burns, Doane, Swecker & Mathis

[57] ABSTRACT

A multi-layered electrostrictive effect element comprises films or thin plates of an electrostrictive material and inner electrodes alternatively arranged in layers, the inner electrodes being formed on the entire surface of the films or thin plates of the electrostrictive material, wherein the insulating layer which insulates the inner electrodes exposed on the side end faces of the element comprises a polyimide resin having repeating units represented by the following general formula (I):

$$\left[ -N \diagup_{CO}^{CO} \diagdown X \diagup_{CO}^{CO} \diagdown N-Y- \right] \quad (I)$$

(wherein X represents a tetravalent group selected from the group consisting of tetravalent phenyl groups; tetravalent biphenyl groups; and tetravalent polyphenyl groups in which at least one of either the phenyl or bipheny groups are bonded through at least one member selected from the group consisting of O, CO, S, $CH_2$, $C(CH_3)_2$ and $C(CF_3)_2$ and Y represents a bivalent groups selected from the group consisting of bivalent phenyl groups; bivalent biphenyl groups; bivalent polyphenyl groups in which at least one of either the phenyl or biphenyl groups are bonded through at least one member selected from the group consisting of O, CO, S, $SO_2$, $CH_2$, $C(CH_3)_2$ and $C(CF_3)_2$; alkylene groups; and xylylene groups) and an insulating filler. A process for making a multi-layered electrorestrictive effect element having a high dielectric strength is also disclosed.

6 Claims, 9 Drawing Sheets

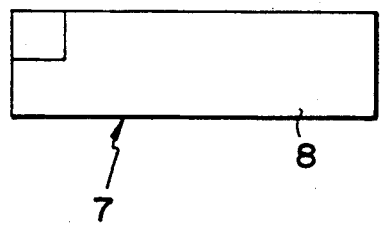
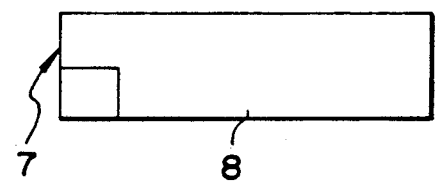
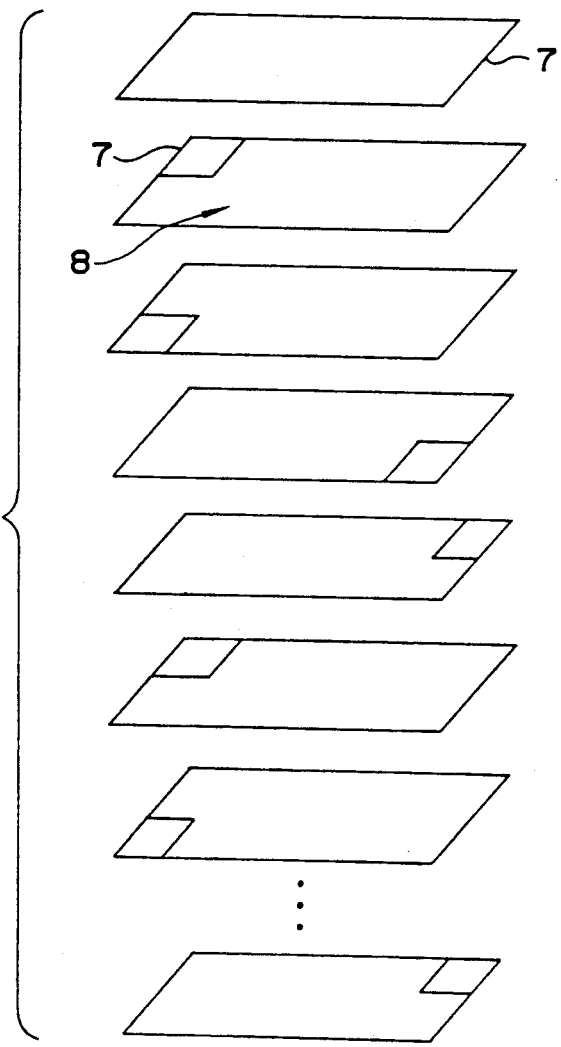

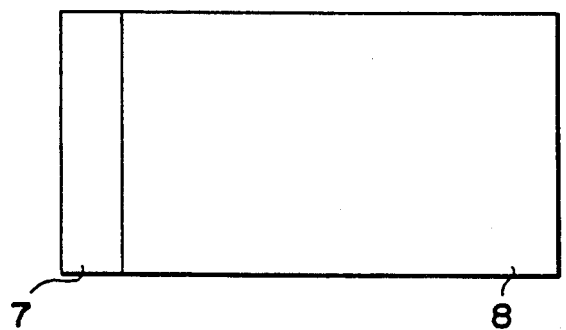
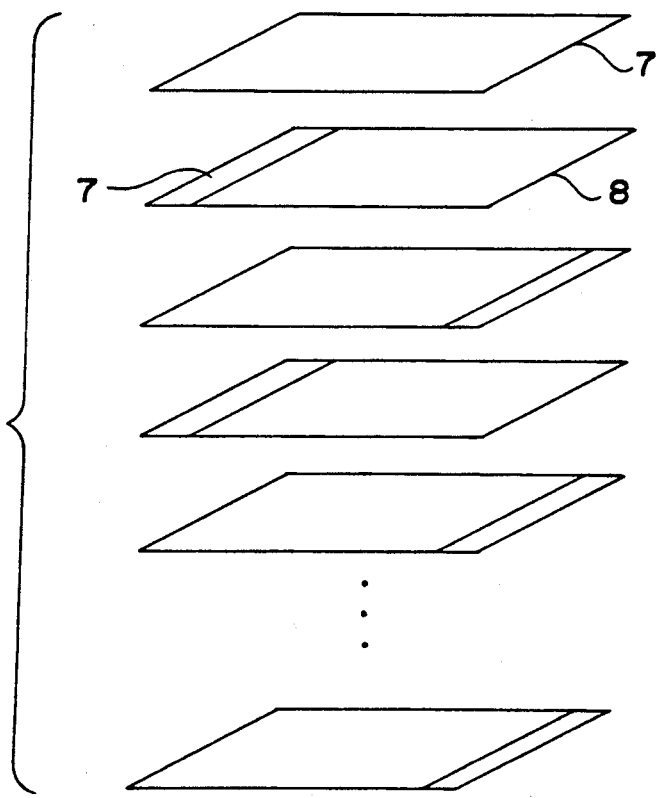

MULTI-LAYERED ELECTROSTRICTIVE EFFECT ELEMENT

The present invention is a continuation-in-part of application Ser. No. 07/544,256, filed Jun. 26, 1990 now abandoned.

BACKGROUND OF THE INVENTION

1. Field of the Invention

The present invention relates to a multi-layered electrostrictive effect element and a method for producing the element.

2. Description of the Prior Art

As mechatronics techniques have been developed, there has been an increased demand for the supply, in large quantities and at a low price, of small-sized and light elements capable of precise fine positioning or those capable of providing a high output force and having a high response speed. Most of the conventional elements are those which make use of magnetic force and are represented by, for instance, motors, solenoids or voice coils, but recently a ceramics element which utilizes the electrostrictive properties have been developed and has attracted special interest. Among these, the elements which make use of an electrostrictive vertical effect have particularly attracted special interest since they can provide a high output force and have a higher response speed. However, the distortion of electrostrictive materials due to this effect is only in the order of $10^{-3}$ even under an electric field of 10 KV/cm. For this reason, there has been proposed an idea which comprises, for the purpose of increasing the displacement, alternatively superimposed electrodes and thin layers of an electrostrictive material which are mechanically in series and electrically in a parallel relation and it has been put into practical use in a specific field.

Among these multi-layered electrostrictive vertical effect elements, those proposed in a relatively early stage of this field are called stacked elements. For instance, such a multi-layered element which comprises 100 sheets of an electrostrictive material having a thickness ranging from 0.5 to 1 mm and electrodes having the same shape alternatively superimposed in layers provide a displacement of the order of only about 100 μm even when a high voltage of the order of about 1000 V is applied thereto (see, for instance, Shuji YAMASHITA, Jpn. J. Appl. Phys., 1981, Suppl. 20, pp. 93-95). This stacked element is relatively large in size and a high voltage must be applied to the element in order to operate it. Therefore, these elements are greatly limited in applications.

On the other hand, Japanese Patent Unexamined Publication (hereinafter referred to as "J.P. KOKAI") No. Sho 58-196068 (TAKAHASHI et al.) proposes a method for producing an element having the same structure observed in the stacked elements, which comprises making use of the green sheet technique to reduce the thickness of each sheet of an electrostrictive material and forming a number of electrodes (inner electrodes), each sandwiched between the layers of the electrostrictive materials on the entire surface of the electrostrictive material. The element can be operated at a low voltage. To industrially produce such elements, it is necessary to electrically communicate every two layers to one another at the ends of the inner electrodes which are exposed at the side end face of the element. J.P. KOKAI No. Sho 59-115579 (OCHI et al.) proposes a solution of the foregoing problem which comprises electro-depositing a glassy inorganic material only on the exposed portions of the inner electrodes and the electrostrictive material adjacent to the exposed portions according to an electrophoresis method to form an insulating layer and to thus form an independent insulating layer for each inner electrode. It is said that, according to this method, the thickness of the layer of the electrostrictive material can be reduced to 0.1 to 0.2 mm and that the driving voltage can be reduced to a level of the order of 100 V. However, in such a method, there still remain a variety of difficulties for accomplishing a highly reliable insulation and thus the same applicant has proposed a variety of improvements concerning the electrophoresis method. Moreover, many attempts have been directed to methods for insulating the inner electrodes other than the electrophoresis method.

These proposals aim at the miniaturization and low voltage-driving of such an element, but there has not yet been proposed any method for reducing the thickness of the electrostrictive material to not more than 0.1 mm.

The multi-layered electrostrictive vertical effect element would be able to be operated at a voltage lower than that for the conventional element if the thickness of the electrostrictive material is further reduced. To this end, it is necessary to finely and precisely form insulating layers for insulating the end of inner electrodes exposed on the side end face of the element. However, if the exposed ends of the inner electrodes are insulated in every two layers to thus form an independent insulating layer for each layer of inner electrode, the inner electrodes which should not be insulated for the reasons such as the restriction concerning the operation and wettability of the insulating material and the electrostrictive material are possibly insulated as the thickness of the electrostrictive material decreases. As a result, inner electrodes which are not electrically connected to an external electrode would be formed and correspondingly, a desired quantity of displacement cannot be achieved.

The inventors of this invention conducted various studies on insulating materials as a means for solving the foregoing problems and have already developed a method comprising the steps of depositing a polyamide acid at the exposed end portions of the inner electrodes through electrophoresis to form a coating layer and then applying heat to convert the polyamide acid resin in the coating layer into a polyimide resin to form an insulating layer of the polyimide resin and have already filed a patent application (see Japanese Patent Application Serial No. Hei 1-171854). The method of this patent application is an epoch-making technique in that it relates to an insulation with an organic material, the use of which has conventionally been considered to be impossible and that it makes it possible to reduce the thickness of each layer of a multi-layered product to 100 μ or less. However, bubbles are liable to be captured in the insulating layer formed according to this method and dielectric breakdown is caused at the portions wherein such bubbles are captured. This leads to a great scattering in the withstand voltage of the resulting products.

SUMMARY OF THE INVENTION

Accordingly, an object of the present invention is to provide a multi-layered electrostrictive effect element free of the foregoing drawbacks and a method for producing the element.

In addition, the inventors of this invention have found out that the foregoing problems arise because an independent insulating layer is formed for each layer of inner electrode. Therefore, another object of the present invention is to provide a multi-layered electrostrictive effect element and a method for producing the element, which makes it possible to completely solve the foregoing problems and to form an insulating layer on only desired portions of the exposed portions of inner electrodes even if the thickness of the electrostrictive material is reduced.

A further object of the present invention is to provide a method for forming an insulating layer, which makes it possible to eliminate unevenness in the thickness of the insulating layer formed, in particular to prevent the formation of an insulating layer which is thick at the periphery of the side face of the element to be coated with the insulating layer and is thin at the center thereof, such an uneven insulating layer being often formed when a conventional method for producing such an element, in other words, to provide a method for insulation capable of leading out a desired quantity of displacement.

The inventors of this invention have conducted intensive studies to solve the foregoing problems, have found out that these problems can effectively be solved by simultaneously depositing a polyamide acid and an insulating filler on the exposed ends of inner electrodes of an element and thus have completed the present invention.

The inventors have also found out that, upon simultaneously depositing a polyamide acid and an insulating filler on the exposed ends of inner electrodes of an element according to an electrophoresis method, a uniform insulating layer can be formed on the side face if the electrophoresis is performed while forming a framework so as to surround the side face of the element to be coated with the insulating layer.

Moreover, the inventors have found out that the foregoing problems can be solved if at least three odd number of continuous inner electrodes are insulated by the same insulating layer.

According to a first embodiment of the present invention, there is provided a multi-layered electrostrictive effect element which comprises films or thin plates of an electrostrictive material and inner electrodes alternatively arranged in layers, the inner electrodes being formed on the entire surface of the films or thin plates of the electrostrictive material, wherein the insulating layer which insulates the inner electrodes exposed on the side end faces of the element comprises a polyimide resin having repeating units represented by the following general formula (I):

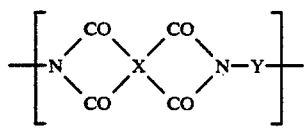

(wherein X represents a tetravalent group selected from the group consisting of tetravalent phenyl groups; tetravalent biphenyl groups; and tetravalent polyphenyl groups in which at least one of either the phenyl or biphenyl groups are bonded through at least one member selected from the group consisting of O, CO, S, CH$_2$, C(CH$_3$)$_2$ and C(CF$_3$)$_2$ and Y represents a bivalent groups selected from the group consisting of bivalent phenyl groups; bivalent biphenyl groups; bivalent polyphenyl groups in which at least one of either the phenyl or biphenyl groups are bonded through at least one member selected from the group consisting of 0, CO, S, SO$_2$, CH$_2$, C(CH$_3$)$_2$ and C(CF$_3$)$_2$; alkylene groups; and xylylene groups) and an insulating filler.

The method for producing the multi-layered electrostrictive effect element according to the first embodiment comprises the steps of immersing an electrostrictive effect element which comprises films or thin plates of an electrostrictive material and inner electrodes alternatively arranged in layers, in which the inner electrodes are formed on the entire surface of the films or thin plates of the electrostrictive material and in which the ends of the inner electrodes are exposed on the side end faces of the element, in an electrophoresis bath for forming a coating layer prepared by neutralizing, with a base, carboxyl groups in a polyamide acid resin having repeating units represented by the following general formula (II):

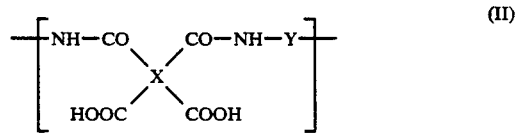

(wherein X represents a tetravalent group selected from the group consisting of tetravalent phenyl groups; tetravalent biphenyl groups; and tetravalent polyphenyl groups in which at least one of either the phenyl or biphenyl groups are bonded through at least one member selected from the group consisting of O, CO, S, CH$_2$, C(CH$_3$)$_2$ and C(CF$_3$)$_2$ and Y represents a bivalent groups selected from the group consisting of bivalent phenyl groups; bivalent biphenyl groups; bivalent polyphenyl groups in which at least one of either the phenyl or biphenyl groups are bonded through at least one member selected from the group consisting of O, CO, S, SO$_2$, CH$_2$, C(CH$_3$)$_2$ and C(CF$_3$)$_2$; alkylene groups; and xylylene groups) present in a composition comprising the foregoing polyamide acid resin and an insulating filler dispersed therein and then diluting the composition with water; applying an electric voltage through the inner electrodes of the electrostrictive element serving as anodes to perform electrophoresis to thereby deposit or form a coating layer of the polyamide acid resin and the insulating filler only on the portions of the inner electrodes exposed on the side end faces of the element and the electrostrictive material in the vicinity of the exposed portions of the inner electrodes, then heating the element to convert the polyamide acid resin in the coating layer into polyimide resin to thus form an insulating layer of the polyimide resin having repeating units represented by the following general formula (I):

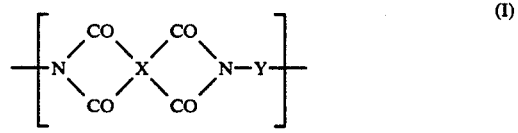

(wherein X and Y are the same as those defined above) and the insulating filler.

The present invention also relates to a variation of the foregoing method wherein the step for forming a coating layer by depositing the polyamide acid resin and the insulating filler through an electrophoresis process is carried out while a framework is disposed, the framework having inner sides which surround the side end face of the multi-layered electrostrictive effect element to be coated with the insulating layer and the framework being fitted to the element so that a part of the inner sides thereof surrounds the side to be covered with the coating layer and comes in close contact with the element and that a part of the inner sides thereof is projected from the element.

The multi-layered electrostrictive effect element according to a second embodiment of the present invention comprises films or thin plates of an electrostrictive material and inner electrodes alternatively arranged in layers, the inner electrodes being formed on the entire surface of the films or thin plates of the electrostrictive material, wherein insulating layers which insulate the inner electrodes exposed on the side end faces of the element comprise m (m is an even number of not less than 4) groups, the insulating layer which comprises the first group continuously extending over and insulating the inner electrodes other than the $(m \times n+1)$-th electrode (n is 0 or a positive integer), the insulating layer which comprises the second group continuously extending over and insulating the inner electrodes other than the $(m \times n+2)$-th electrode, the insulating layer which comprises the third group continuously extending over and insulating the inner electrodes other than the $(m \times n+3)$-th electrode and so forth, and the insulating layer which comprises the m-th group continuously extending over and insulating the inner electrodes other than the $(m \times n+m)$-th electrode; and an external electrode being electrically connected to every m layers of inner electrodes laminated is formed over the insulating layer of each group.

The method for producing the multi-layered electrostrictive effect element according to the second embodiment comprises:

a first step which comprises forming m (m is an even number of not less than 4) temporary external electrodes on a multi-layered sintered body which comprises films or thin plates of an electrostrictive material and inner electrodes alternatively arranged in layers, the external electrodes being formed so that the first temporary external electrode is electrically connected to the inner electrodes other than the $(m \times n+1)$-th electrode (n is 0 or a positive integer), the second temporary external electrode is electrically connected to the inner electrodes other than the $(m \times n+2)$-th electrode, the third temporary external electrode is electrically connected to the inner electrodes other than the $(m \times n+3)$-th electrode and so forth, and the m-th temporary external electrode is electrically connected to the inner electrodes other than the $(m \times n+m)$-th electrode; and connecting each temporary external electrode to a lead wire;

a second step which comprises forming m groups of insulating layers on the exposed end faces of the inner electrodes of the multi-layered sintered body provided with lead wires obtained in the first step and the electrostrictive material in the vicinity of the exposed end faces by an electrophoresis method, the insulating layers being formed so that the insulating layer which comprises the first group continuously extends over and insulates the inner electrodes other than the $(m \times n+1)$-th electrode (n is 0 or a positive integer), the insulating layer which comprises the second group continuously extends over and insulates the inner electrodes other than the $(m \times n+2)$-th electrode, the insulating layer which comprises the third group continuously extends over and insulates the inner electrodes other than the $(m \times n+3)$-th electrode and so forth, and the insulating layer which comprises the m-th group continuously extending over and insulating the inner electrodes other than the $(m \times n+m)$-th electrode;

a third step which comprises forming an external electrode electrically connected to every m layers of inner electrodes laminated, over the insulating layers of each group obtained in the second step; and a fourth step comprising cutting off the temporary external electrodes with the lead wires.

The present invention also relates to a variation of the foregoing method for producing the multi-layered electrostrictive effect element according to the second embodiment of the invention wherein the second step for forming a coating layer by depositing the polyamide acid resin and the insulating filler through an electrophoresis process is carried out while a framework is disposed, the framework having inner sides which surround the side end face of the multi-layered electrostrictive effect element to be coated with the insulating layer and the framework being fitted to the element so that a part of the inner sides thereof surrounds the side to be covered with the coating layer and comes in close contact with the element and that a part of the inner sides thereof is projected from the element.

BRIEF DESCRIPTION OF THE DRAWINGS

FIG. 3(a), FIG. 3(b), FIG. 4, FIG. 5(a), FIG. 5(b), FIG. 5(c), FIG. 6 and FIG. 7 are perspective views, plan views and longitudinal cross sectional views for illustrating, in order, each process of the method for producing the multi-layer electrostrictive effect element according to the present invention practiced in Example 8;

FIGS. 9 to 12 are a perspective view, a plan view and a longitudinal cross sectional view for illustrating, in order, each process of the method for producing the multi-layered electrostrictivce effect element of thje present invention carried out in Example 9;

DESCRIPTION OF THE PREFERRED EMBODIMENTS

Figure 1A:
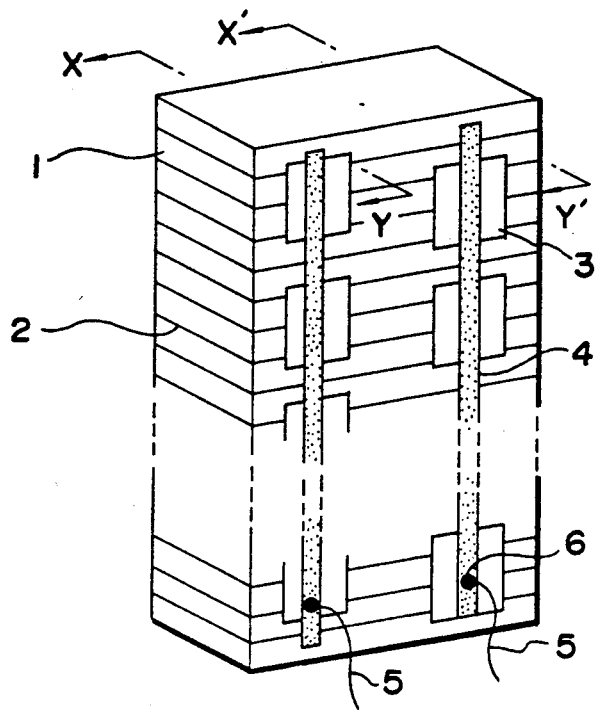
FIG. 1(a) to FIG. 1(c) are a perspective view of an embodiment of the present invention and longitudinal cross sectional views taken along the lines X-Y and X'-Y' of the perspective view, respectively.

The term "electrostrictive material(s)" herein used means all the materials which can exhibit distortion effect upon applying an electric voltage and, more specifically, means piezo-electric materials whose distortion factor is approximately in proportion to the magnitude of the electric field applied and electrostrictive materials whose distortion factor is approximately in proportion to square of the magnitude of the electric field applied.

The aforementioned polyamide acid resin used in the method of the present invention may partially converted into an imide form in advance.

In the foregoing polyimide resins having repeating units represented by the general formula (I) and the polyamide acid resins having repeating units represented by the general formula (II), specific examples of X are as follows:

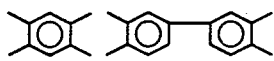,

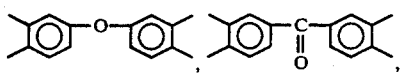,

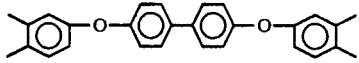,

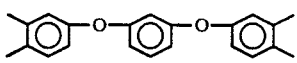,

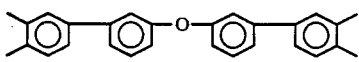,

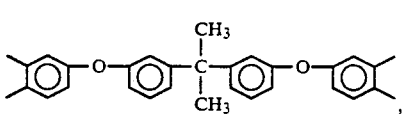,

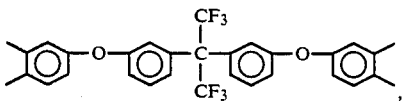,

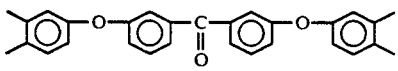,

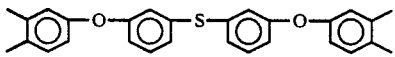,

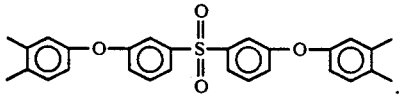.

On the other hand, specific examples of Y in the general formulae (I) and (II) are as follows:

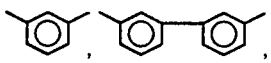,

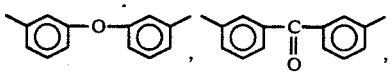,

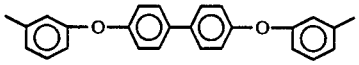,

-continued

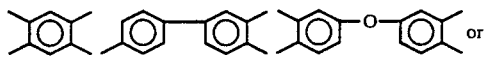,

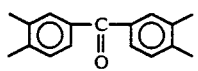,

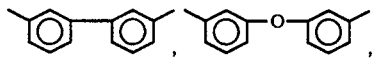,

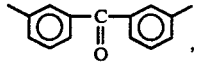,

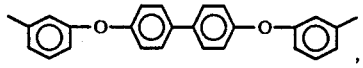,

,

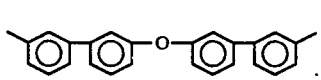.

If the adhesion and heat resistance of the polyimide resins having repeating units represented by the general formula (I) to the basic material for electrostrictive effect element are taken into consideration, particularly preferred X's are as follows:

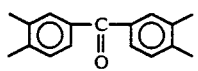 or

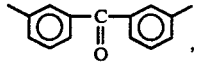

and particularly preferred Y's are as follows:

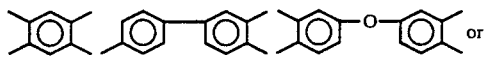,

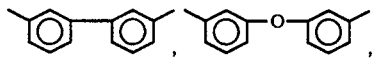,

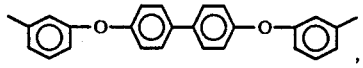,

 or

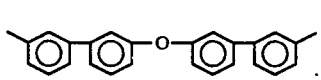.

The polyamide acid resins having repeating units represented by the general formula (II) used in the method of this invention can be obtained through an addition reaction of tetracarboxylic acid anhydrides represented by the following general formula (III):

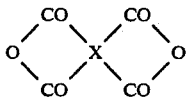

(III)

wherein X is the same as that defined above with diamines represented by the following general formula (IV):

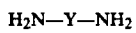

(IV)

wherein Y is the same as that defined above.

Preferred examples of the foregoing tetracarboxylic acid anhydrides are pyromellitic acid dianhydride, 3,3',4,4'-benzophenonetetracarboxylic acid dianhydride, 2,2',3,3'-benzophenonetetracarboxylic acid dianhydride, 3,3',4,4'-biphenyltetracarboxylic acid dianhydride, 2,2',3,3'-biphenyltetracarboxylic acid dianhydride, 2,2-bis(3,4-dicarboxyphenyl)propane dianhydride, 2,2-bis(2,3-dicarboxyphenyl)propane dianhydride, bis(3,4-dicarboxyphenyl) ether dianhydride, bis(3,4 dicarboxyphenyl) sulfone dianhydride, 1,1-bis(2,3-dicarboxyphenyl) ethane dianhydride, bis(2,3-dicarboxyphenyl) methane dianhydride, bis(3,4-dicarboxyphenyl) methane dianhydride, 2,3,6,7 naphthalenetetracarboxylic acid dianhydride, 1,4,5,8-naphthalenetetracarboxylic acid dianhydride, 1,2,5,6-naphthalenetetracarboxylic acid dianhydride, 1,2,3,4-benzenetetracarboxylic acid dianhydride, 3,4,9,10-perylenetetracarboxylic acid dianhydride, 2,3,6,7-anthracenetetracarboxylic acid dianhydride and 1,2,7,8-phenanthrenetetracarboxylic acid dianhydride. Particularly preferred tetracarboxylic acid dianhydrides are pyromellitic acid dianhydride, 3,3',4,4'-benzophenonetetracarboxylic acid dianhydride, 3,3',4,4'-bisphenyltetracarboxylic acid dianhydride and bis(3,4-dicarboxyphenyl) ether dianhydride.

Specific examples of the aforesaid diamines are metadiamines such as 3,3'-diaminobenzophenone, 1,3-bis(3-aminophenoxy)benzene, 4,4'-bis(3-aminophenoxy)biphenyl, 2,2-bis(4-(3-aminophenoxy)phenyl) propane, 2,2-bis(4-(3-aminophenoxy)phenyl)-1,1,1,3,3,3-hexafluoropropane, bis(4-(3-aminophenoxy)phenyl) sulfide, bis(4-(3-aminophenoxy) phenyl) ketone and bis(4-(3-aminophenoxy)phenyl) sulfone. These amines can be used alone or in combination of two or more of them.

The reaction of the foregoing tetracarboxylic acid anhydride with the diamine is generally performed in an organic solvent. Examples of such organic solvents are N-methyl-2-pyrrolidone, N,N-dimethylacetamide, N,N-dimethylformamide, 1,3-dimethyl-2-imidazolidinone, N,N-diethylacetamide, N,N-dimethylmethoxyacetamide, dimethylsulfoxide, pyridine, dimethylsulfone, hexamethylphosphoramide, tetramethyl urea, N-methylcaprolactam, tetrahydrofuran, m-dioxane, p-dioxane, 1,2-dimethoxyethane, bis(2-methoxyethyl) ether, 1,2-bis(2-methoxyethoxy)ethane and bis(2-(2-methoxyethoxy)ethyl) ether. These organic solvents may be used alone or in combination of two or more of them.

The reaction temperature in general ranges from −20° C. to 200° C., preferably −10° C. to 50° C. and more preferably 0° C. to room temperature.

The pressure of the reaction is not restricted to a particular range, but the reaction can be carried out at atmospheric pressure efficiently.

The reaction time varies depending on various factors such as the kinds of solvents used, the reaction temperature selected and the kinds of diamines and acid dianhydrides used. However, it in general takes 2 to 40 hours and preferably 4 to 24 hours to complete the formation of polyamide acid resins.

The solution of the polyamide acid resin thus obtained desirably contains 5 to 40% by weight of the polyamide acid resin and has a logarithmic viscosity ranging from 0.5 to 4 dl/g (determined at 35° C., on a 0.5 g/ml solution in N,N-dimethylacetamide) from the viewpoint of the water-solubility and film-forming properties of the polyimide obtained after heat-treatment.

In the present invention, it is an important feature to add an insulating filler to the polyamide acid resin obtained above. Any method for adding such an insulating filler may be employed as long as the insulating filler can be uniformly dispersed in the polyamide acid resin. Examples of such methods are roll kneading and ball milling techniques. The amount of the insulating filler preferably ranges from 2 to 70% by volume on the basis of the total volume of the mixture. If the amount thereof is too small, the intended effect of the filler cannot be attained, while if it is too great, the insulating filler causes precipitation in the final electrophoresis bath.

The insulating fillers usable in the present invention may be either inorganic or organic compounds as long as they have an electric resistivity on the order of not lower than $10^5$ Ω·cm. Examples of inorganic compounds used as such insulating fillers are oxides or composite oxides of beryllium, magnesium, calcium, aluminum, boron, silicon, scandium, yttrium, lanthanum, titanium, zirconium, hafnium and rare earth elements; nitrides and oxynitrides of aluminum, boron, silicon, titanium, zirconium, hafnium or the like; and carbides such as silicon carbide. On the other hand, the organic compounds which may be used as such insulating fillers must not be dissolved in the electrophoresis bath and examples of such organic compounds are silicone resins, fluorine plastics represented by Teflons, phenolic resins, furan resins, epoxy resins and acrylic resins.

The insulating fillers may have any shape such as a particulate or fibrous form, but the size thereof is critical and determined as a function of the desired thickness of the resulting insulating layer. More specifically, the maximum diameter of the insulating filler must be smaller than the minimum thickness of the insulating layer. In addition, it is important that the insulating filler be in a well dispersed state in the electrophoresis bath from the industrial point of view. Thus, the average diameter of the insulating filler is not greater than 20 μm and preferably not greater than 10 μm.

In the method of the present invention, the polyamide acid resin having the repeating units represented by the general formula (II) which comprises the insulating filler dispersed therein becomes soluble in water because COOH groups thereof dissociate into COO$^-$ ions through the addition of a base such as amines or alkali metal ions in the presence of water or form a stable colloidal dispersion. Therefore, the polyamide acid resin is deposited on the multi-layered electrostrictive effect element during electrophoresis and is made insoluble in water.

As the foregoing bases, there may be used, for instance, ammonia; secondary amines such as dialkylamines, diethanolamine and morpholine; tertiary amines such as triethylamine, tributylamine, triethanolamine, triisopropanolamine, dimethylethanolamine, dimethylisopropanolamine, diethylethanolamine and dimethylbenzylamine; and inorganic bases such as sodium hydroxide and potassium hydroxide. Particulatly preferred are tertiary amines in view of their stability after diluting with water and properties of the resulting film.

The amount of the base required for the polyamide acid resin to be able to be diluted with water in general ranges from 30 to 110 mole % and preferably 40 to 100 mole % with respect to the carboxyl equivalent of the polyamide acid to be neutralized. Thus, the polyamide acid becomes completely water-soluble or partially soluble in water to form a suspension by such neutralization. Thus, the polyamide acid resin can be diluted with water.

An electrophoresis bath for forming layers can thus be obtained by diluting the neutralized composition with water. Therefore, the bath comprises a suspension containing the polyamide acid resin and an insulating filler covered with the polyamide acid resin.

It is preferred that, in the method for producing the multi-layered electrostrictive effect element of the present invention, the step for forming a coating layer by depositing the polyamide acid resin and the insulating filler through an electrophoresis process is carried out while a framework is disposed, the framework having inner sides which surround the side end face of the multi-layered electrostrictive effect element to be coated with the insulating layer and the framework being fitted to the element so that a part of the inner sides thereof surrounds the side to be covered with the coating layer and comes in close contact with the element and that a part of the inner sides thereof is projected from the element. This is because no or only slight unevenness of the thickness of the coating film is observed on the side face.

If this framework is not used, the coating film becomes thick at the periphery of the side face of the element to which the coating film is applied and becomes thin at the center of the side face. Thus, dielectric breakdown is liable to occur at the center thereof. If the thickness of the coating film at the center of the side face is increased to make the reliability of the resulting element higher, the film at the periphery becomes thicker. As a result, even the exposed ends of the inner electrodes which should not be covered with the film are also covered with the coating film and this sometimes leads to the displacement of the element substantially lower than the predetermined level.

Materials for such a framework may be any ones so long as they are not dissolved or peeled off in the electrophoresis bath for forming the coating film. Typical examples thereof are insulating tapes such as paper tapes, cellophane tapes and polyvinyl chloride tapes and the framework can be formed by attaching such a tape to the element so that a part of the inner sides thereof surrounds the side to be covered with the coating layer and comes in close contact with the element and that a part of the inner sides thereof is projected from the element. The framework may also be formed from materials having flexibility such as plastics and rubbers. In this case, the framework can be formed by winding a band-like substance around the multi-layered electrostrictive effect element in the form of a loop or by making a hole in a material having a relatively large thickness and inserting the multi-layered electrostrictive effect element into the hole. In the latter case, it is also possible to make a plurality of holes on such a thick material and inserting a plurality of elements into every hole to simultaneously perform electrophoresis for a plurality of elements.

The coating film of the polyamide acid resin and the insulating filler thus deposited on the side face of the element are heat-treated to convert the film into a film comprising a polyimide resin having repeating units represented by the following general formula (I):

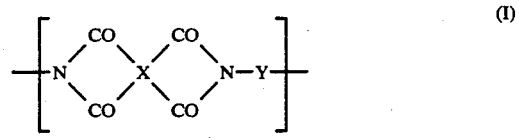

(wherein X has the same meaning as that defined above) and the insulating filler. This heat-treatment is carried out at a temperature ranging from 80° to 300° C. and preferably 150° to 280° C.

The insulating layer of the polyimide resin and the insulating filler thus formed is similar to that disclosed in the patent filed by the instant applicant (see J.P. KOKAI No. Hei 1-171854) in that it is very excellent in dielectric strength and adhesion to metals, but the rate of rejects which cause dielectric breakdown at a low voltage is very low as compared with that for the element obtained using only the polyimide resin as will become clear from the following Examples.

The multi-layered body herein means not only those prepared by the green sheet method but also those called stacked ones which are obtained by bonding a predetermined number of sintered thin plates together with an adhesive.

The precise contribution of the insulating filler to the lowering of the rate of rejects has not yet been clearly elucidated. The films comprising only a polyimide resin which causes dielectric breakdown at a low voltage often include fine air bubbles, but those obtained from a combination of the polyimide resin and the insulating filler contain no or only a small quantity of air bubbles. This seems to indicate that the insulating filler possibly prevents the encapsulation of air bubbles in the resulting insulating film during the electrophoresis and that it promotes the formation of an insulating layer having a uniform thickness.

Figure 1B:
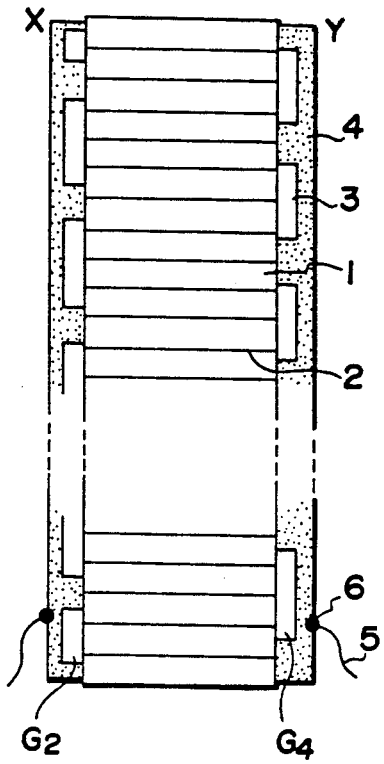
Figure 1C:
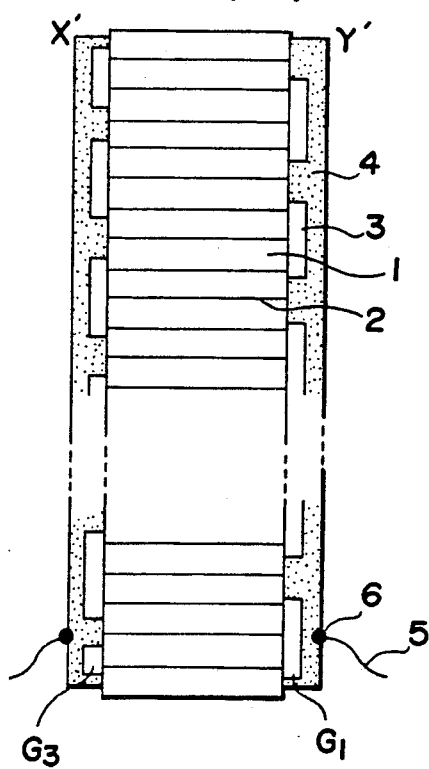
Figure 2:
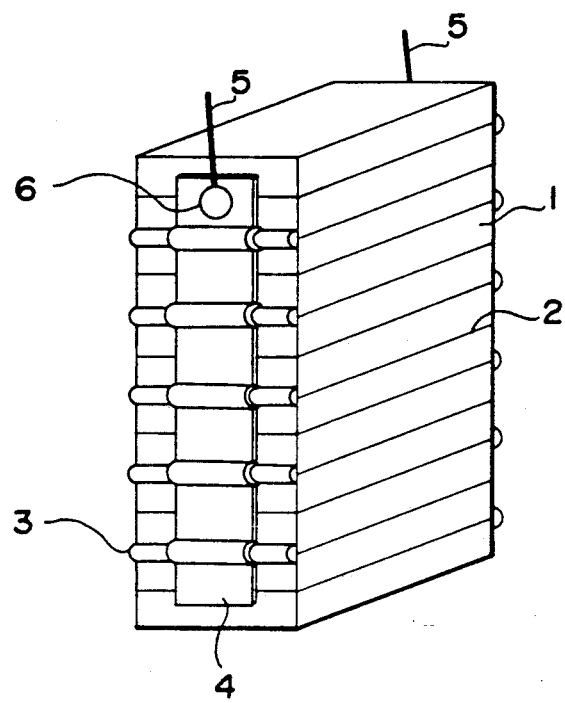
FIG. 2(a) and FIG. 2(b) are a perspective view of a conventional multi-layered electrostrictive effect element and a longitudinal cross sectional view taken along the line X-Y of the perspective view, respectively.
Figure 2:
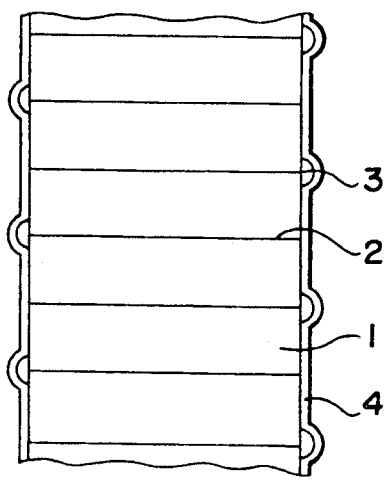

FIG. 1 shows an embodiment of the multi-layered electrostrictive effect element according to the present invention. The element of the present invention includes m groups, for instance, 4 groups of insulating layers, the insulating layer of each group continuously extends over the inner electrodes other than every m layers of inner electrodes and there is one inner electrode, which is not insulated, in every m layers of the inner electrodes. The insulating layer having such a structure can be produced according to the electrophoresis method as will be detailed below. When comparing this structure of the insulating layer with that for the conventional element shown in FIG. 2 wherein there are two groups of independent insulating layers formed in every two layers of inner electrodes, the insulating material is locally applied to only the predetermined portions and, therefore, precise and fine insulation can be accomplished. The inventors do not want to be bound by any particular theory, but assume that if an insulating layer continuously extends over (m−1) layers of inner electrodes, the possibility of covering the ends of the inner electrode to be exposed can be lowered compared with the conventional element in which an independent insulating layer is applied to every two layers and thus only the predetermined portions can be insulated. Each external electrode electrically connected to the ends of every m layers of the inner electrodes is formed over each group of insulating layers thus applied and these m external electrodes are connected to a power supply so that the polarity varies between each pair of the neighbouring two inner electrodes (for instance, the polality of the first group (G1) is the same as that of the third (G3) group and that of the second group (G2) is identical with that of the fourth group (G4) as shown in FIG. 1(b) and FIG. 1(c)).

The insulating materials used in the second embodiment of the present invention may be organic and inorganic materials, but are preferably organic materials. Inorganic materials have low elasticity and hence is liable to cause cracks and have low reliability. However, organic materials do not suffer from such drawbacks and thus are preferably employed in the present invention. Among organic materials, a polyimide resin containing an insulating filler is particularly preferred because of high heat resistance during soldering in addition to the foregoing merits. The polyimide resins and insulating fillers usable in the second embodiment of the present invention are, for instance, those listed above in connection with the first embodiment of the invention.

The element of the present invention may have any shape such as cylinders, truncated cones, truncated quadrangular pyramids, octagonal prisms and truncated octagonal pyramids and the m groups, for instance, 4 groups of insulating layers may be formed on any position. In FIG. 1, the end faces of the inner electrodes other than the 4 groups of insulating layers and the neighbourhood thereof are exposed, but in the present invention, these portions may be covered with the insulating layer without any troubles.

As a rule, the method for producing the electrostrictive vertical effect element according to the present invention comprises the following steps. First, the multi-layered sintered body can be produced in accordance with any known method. More specifically, if it is produced according to a doctor blade method, green sheets of an electrostrictive material are prepared, then a paste for forming an inner electrode such as a silver, silver-palladium alloy, platinum, nickel or copper paste is applied to each green sheet by printing, a plurality of the green sheets are put in layers, thermocompression-bonded to one another and the resulting multi-layered body is sintered after degreasing to give a sintered multi-layered body.

If the multi-layered sintered body is produced according to a lamination method, first molded bodies of an electrostrictive material are formed and sintered to give a block-like sintered body. Then the block is cut into thin plates having a desired thickness and the plates and metal thin films are laminated alternatively with an adhesive to thus give a multi-layered sintered body.

In any case, it is very important in making a multi-layered sintered body that the inner electrodes are formed in a shape such that a portion, on which any inner electrode is not present and each of m (for instance 4) external temporary electrodes is subsequently formed in the first step as will be explained below, is left on each m-th layer along the laminating direction as shown in FIG. 4.

The element according to the present invention can be produced by forming m temporary external electrodes on the multi-layered sintered body as has been explained above followed by the first step for electrically connecting the temporary external electrodes to lead wires, the second step for forming m groups of insulating layers, the third step for forming an external electrode through each of the m groups of insulating layers and optionally for electrically connecting the external electrodes to lead wires and the fourth step for disconnecting the m temporary external electrodes from the lead wires connected in the first step.

In the following description, an embodiment in which m is 4 will be given for simplifying the explanation.

In the first step, a conductive paste is applied to 4 portions on the multi-layered sintered body produced by the foregoing manner to form temporary external electrodes. At this time, the first temporary external electrode is electrically connected to the inner electrodes other than $(4n+1)$-th (wherein n is 0 or a positive integer) inner electrode, the second temporary external electrode is electrically connected to the inner electrodes other than $(4n+2)$-th inner electrode, the third temporary external electrode is electrically connected to the inner electrodes other than $(4n+3)$-th inner electrode and the fourth temporary external electrode is electrically connected to the inner electrodes other than $(4n+4)$-th inner electrode. Then each temporary external electrode is connected to each corresponding lead wire.

In the second step, the lead wires are connected to a DC current source so that one temporary external electrode serves as an anode and the counter-temporary external electrode serves as a cathode and a polyamide acid resin and an insulating filler for three layers are continuously deposited on the exposed ends of the inner electrodes and the electrostrictive material in the vicinity of the exposed ends in a bath for electrodeposition according to the electrophoresis method to thus form a coating layer. At this stage, it is preferred that the step for forming a coating layer by depositing the polyamide acid resin and the insulating filler through an electrophoresis process is carried out while a framework is disposed, the framework having inner sides which surround the side end face of the multi-layered sintered body to be coated with the insulating layer and the framework being fitted to the sintered body so that a part of the inner sides thereof surrounds the side to be covered with the coating layer and comes in close contact with the sintered body and that a part of the inner sides thereof is projected from the sintered body. This is because no or only slight unevenness of the thickness of the coating film is observed on the side face if such a framework is employed.

The framework is removed after the electrophoresis is completed. Then the resulting sintered body covered with the coating film is heated to convert the polyamide acid resin into a polyimide resin to thus form one group of insulating layer. The foregoing procedures are repeated 4 times in all for every temporary external electrodes to thus form 4 groups of insulating layers. At this stage, the portion on which the polyamide acid resin and the insulating filler should not be deposited must be covered with, for instance, a tape. After the completion of this step, there are 4 groups of insulating layers on the element, the insulating layer of each group continuously extends over the three exposed ends of the inner electrodes and in every 4 layers, there is one exposed end of the inner electrode which is not insulated. Alternatively, immediately after forming one group of the insulating layer, the third step, i.e., the formation of an external electrode on the ends of the inner electrodes through the insulating layer and electrical connection of the external electrode to a lead wire, can be carried out and the next insulating layer is then formed.

As will be described in the following Examples, in the procedures up to the second step, a plurality of elements can simultaneously be processed and, therefore, the resulting assembly may be cut into individual elements before the subsequent step. In addition, the temporary external electrodes may be removed at this stage. In the third step, an external electrode is formed on each group of insulating layers formed in the preceding step to thus electrically connect every 4 inner electrodes thereto and further each external electrode is electrically connected to a lead wire. Therefore, 4 lead wires are in general required, but if the four external electrodes are connected two by two so that the inner electrodes opposite to one another have different polarities to thus form two sets of external electrodes on the electrical standpoint, the number of lead wire required becomes 2.

The external electrode can be formed by applying a conductive paste or according to a vapor deposition method. The electrical connection between the external electrode and the lead wire is in general performed by soldering, but may be performed with a conductive adhesive.

After completion of the third step, the 4 temporary external electrodes are in general disconnected from the corresponding lead wires. Moreover, when a plurality of elements are simultaneously produced as will be described in Example 1, the assembly is cut into individual elements.

The present invention will hereunder be explained in more detail with reference to the following non-limitative working Examples and the effects practically accomplished by the present invention will also be discussed in comparison with Comparative Examples.

EXAMPLE 1

In a reactor equipped with a stirring machine, a reflux condenser and a tube for introducing nitrogen gas, 53.0 g (0.25 mole) of 3,3'-diaminobenzophenone was dissolved in 240 ml of N,N-dimethylacetamide. To the resulting solution, there was added 78.6 g (0.244 mole) of powdery 3,3',4,4'-benzophenonetetracarboxylic acid dianhydride and the contents of the reactor was stirred at 10° C. for 24 hours to give a solution of a polyamide acid. To the polyamide acid solution, there was added 620 g of alumina powder (available from Sumitomo Chemical Company, Limited under the trade name of AKP-30) and the mixture was kneaded with a three-roll mill to thus prepare an alumina-dispersed polyamide acid varnish. 21.7 g (50 mole % with respect to the carboxy equivalent) of dimethylethanoamine was slowly added to the varnish, the mixture was stirred at room temperature for 20 minutes and then diluted with water by slowly adding 905.3 g of water at room temperature with stirring to thus give an alumina powder-containing polyamide acid suspension.

A sample of multi-layered body (which comprised 50 layers, each having a thickness of about 100 μm) was produced in advance, the ends of the inner electrodes in every second layer being exposed on one side of the body and all of the ends thereof being exposed on the other side of the body. A silver electrode was baked on the side wherein the ends of the inner electrodes in every second layers were exposed and a lead wire was connected to the silver electrode by soldering. The suspension prepared above was introduced into a plastic bath to thus provide an electrophoresis bath for forming a coating film, the multi-layered body serving as an anode was immersed in the bath and the anode was connected to the positive pole of a power supply. The electrophoresis was performed for 5 seconds by applying a voltage of 20 V. Then the multi-layered body was withdrawn from the bath, washed with an aqueous solution containing 20% by weight of N,N-dimethylacetamide and heat-treated at 150° C. for 2 hours and then at 280° C. for 2 hours to convert the polyamide acid resin into a polyimide resin. Thereafter, the multi-layered body was cut into two pieces at the center thereof, a silver electrode was applied onto the side on which the insulating layer of the polyimide resin was formed and was connected to a lead wire. The same electrophoresis operation was repeated to give a multi-layered body wherein each electrode had an insulating layer on either of the right and left sides. The thickness of the insulating layer was in the order of 50 μ. The dielectric strength of the multi-layered bodies thus produced was determined and it was found that 98 bodies out of 100 bodies examined had a dielectric breakdown voltage of not less than 1000 V and that the remaining two bodies caused dielectric breakdown at about 90 V and 310 V respectively.

COMPARATIVE EXAMPLE 1

The same procedures used in Example 1 were repeated except that a varnish was prepared without using alumina powder and that 39.1 g of dimethylethanolamine was added to the varnish instead of 21.7 g of the amine to give an aqueous solution of polyamide acid for electrophoresis. Likewise, the same procedures used in Example 1 were repeated except that the foregoing polyamide acid solution was used as a bath for electrophoresis and that the electrophoresis was performed at a voltage of 100 V for 20 seconds to form insulating layers on the multi-layered body (the thickness of the insulating layer was about 50 μ).

The dielectric strength of the multi-layered bodies thus produced was determined and it was found that 78 bodies out of 100 bodies examined had a dielectric breakdown voltage of not less than 1000 V and that 17 bodies out of 100 had a dielectric breakdown voltage of not more than 100 V, 3 bodies out of 100 had a dielectric breakdown voltage ranging from 100 to 200 V and the remaining two bodies caused dielectric breakdown at 200 to 300 V respectively.

EXAMPLE 2

In the method of Example 1, the heat-treatment for converting the polyamide acid resin into the polyimide resin was performed at a temperature of 180° C. or 250° C., but the same results were obtained in both cases.

EXAMPLE 3

The same procedures used in Example 1 were repeated except that titania powder (average particle size=0.8 μ) was substituted for the alumina powder used in Example 1. The dielectric strength of the multi layered bodies thus produced was determined and it was found that 97 bodies out of 100 bodies examined had a dielectric breakdown voltage of not less than 1000 V, 2 bodies out of 100 had a dielectric breakdown voltage ranging from 200 to 300 V and the remaining one body caused dielectric breakdown at a voltage ranging from 500 to 600 V.

EXAMPLE 4

The same procedures used in Example 1 were repeated except that silica powder (average particle size=0.5 μ) was substituted for the alumina powder used in Example 1. The dielectric strength of the multi-layered bodies thus produced was determined and it was found that 99 bodies out of 100 bodies examined had a dielectric breakdown voltage of not less than 1000 V and the remaining one body caused dielectric breakdown at 273 V.

EXAMPLE 5

The same procedures used in Example 1 were repeated except that silicon nitride powder (average particle size=0.8 μ) was substituted for the alumina powder used in Example 1. The dielectric strength of the multi-layered bodies thus produced was determined and it was found that 98 bodies out of 100 bodies examined had a dielectric breakdown voltage of not less than 1000 V and the remaining two bodies caused dielectric breakdown at 260 V and 543 V, respectively.

EXAMPLE 6

To a container equipped with a stirring machine, a reflux condenser and a tube for introducing nitrogen gas, there were added 41.0 g (0.1 mole) of 2,2-bis(4-(3-aminophenoxy)phenyl) propane and 200 ml of N,N-dimethylacetamide, followed by cooling to around 0° C., the addition of 21.8 g (0.1 mole) of powdery pyromellitic acid dianhydride and stirring at about 0° C. for 2 hours. Then the temperature of the solution was brought back to room temperature and the solution was stirred for about 20 hours in a nitrogen gas atmosphere. The logarithmic viscosity of the polyamide acid solution thus obtained was found to be 1.5 dl/g. To the polyamide acid solution there was added alumina powder (available from Sumitomo Chemical Company, Limited under the trade name of AKP-30) so that the content of alumina reached 35% by volume and the mixture was kneaded sufficiently with a three-roll mill until the alumina powder was sufficiently dispersed in the solution. To the resulting alumina powder-containing polyamide acid solution, there was slowly added 10.1 g (50 mole % with respect to the carboxyl equivalent) of triethylamine, the mixture was stirred at room temperature for one hour, then diluted by slowly adding 973 g of water with stirring to give an alumina powder-containing polyamide acid suspension.

Insulating layers were applied onto a multi-layered body identical with that used in Example 1 using the polyamide acid suspension prepared above in the same manner used in Example 1. The thickness of the insulating layer was about 50 μ.

The dielectric strength of the multi-layered bodies thus produced was determined and it was found that 97 bodies out of 100 bodies examined had a dielectric breakdown voltage of not less than 1000 V and the remaining three bodies caused dielectric breakdown at voltages of 16 V, 193 V and 862 V, respectively.

COMPARATIVE EXAMPLE 2

The same procedures used in Example 6 were repeated except that the process for adding alumina powder and kneading with a roll mill was omitted and that 20.2 g of triethylamine was substituted for 10.1 g thereof to form an aqueous polyamide acid solution for electrophoresis. Insulating layers were applied onto a multi-layered body using the aqueous polyamide acid solution prepared above in the same manner used in Example 6 except that the electrophoresis was carried out at 100 V for 20 seconds. The thickness of the insulating layer was about 50 μ.

The dielectric strength of the multi-layered bodies thus produced was determined and it was found that 84 bodies out of 100 bodies examined had a dielectric breakdown voltage of not less than 1000 V, 11 bodies out of 100 bodies had a dielectric breakdown voltage of not more than 100 V, 2 out of 100 had a dielectric breakdown voltage ranging from 200 to 300 V and the remaining three bodies caused dielectric breakdown at 16 V, 193 V and 862 V, respectively.

EXAMPLE 7

The same procedures used in Example 1 were repeated except that fine particles of a phenol resin (available from UNITIKA Ltd. under the trade name of UNIBEX C which was classified to adjust the particle size to not more than 10 μm) was substituted for the alumina powder used in Example 1. The dielectric strength of the multi-layered bodies thus produced was determined and it was found that 90 bodies out of 100 bodies examined had a dielectric breakdown voltage of not less than 1000 V.

EXAMPLE 8

Powder of $(Pb_x, Ba_{1-x})(Zr_y, Ti_{1-y})O_3$ (wherein $x=0.73$ and $y=0.55$) to which a trace amount of an additive had been dispersed in the form of a solid solution was prepared and divided into two portions.

One portion of the powder was introduced into a metal mold and it was subjected to press molding under a load of 1 ton/cm$^2$ to give a disk-like molded body. The molded body was sintered at 320° C. for 3 hours and then the surface thereof was ground to form a disk-like sintered body having a thickness of 0.5 mm. Electrodes were formed on both upper and lower sides of the disk-like sintered body, a voltage of 500 V (electric field=10 KV/cm) was applied to the sintered body, the elongation thereof along the direction of the applied potential and it was found to be about 0.11%.

The other portion of the powder was formed into a green sheet having a thickness of about 0.1 mm according to the doctor blade method and cut into small pieces having a size of 7 mm×50 mm with a die cutter. A platinum paste was applied to the surface of 50 sheets of such small pieces in a pattern as shown in FIG. 3(a) and to the surface of different 50 sheets of such small pieces in a pattern as shown in FIG. 3(b) according to the screen printing method. The printed green sheets of the small pieces were put in layers in the order as shown in FIG. 4, thermocompression-bonded at a temperature of 120° C. and a load of 150 kg/cm$^2$ on a hot plate, introduced into a furnace for degreasing and the temperature of the furnace was slowly raised up to 50° C. to perform degreasing. Then the degreased multi-layered body was transferred to a sintering furnace and sintered at 1320° C. for 3 hours. The distance between the neighbouring inner electrodes of the sintered body was 0.08 mm and as shown in FIG. 4, in every 4th layer the inner electrodes did not reach either of the 4 corners of each layer and each inner electrode was designed so that it always reached at least three corners of each layer. A silver paste was applied to the portions around these 4 corners to form temporary external electrodes and they were electrically connected to lead wires by soldering.

Figure 5A:
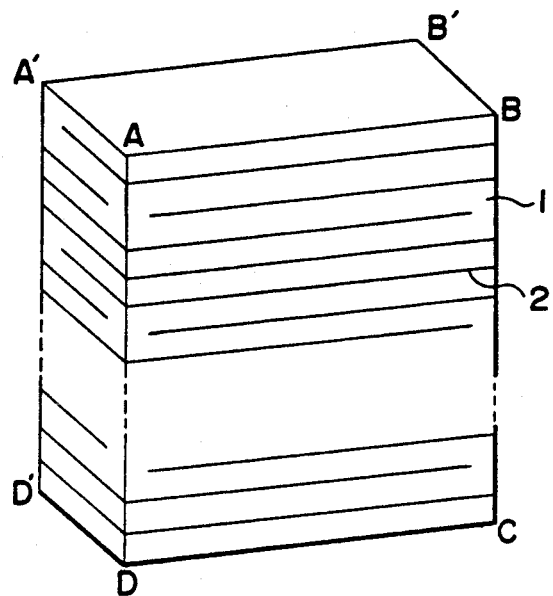
Figure 5B:
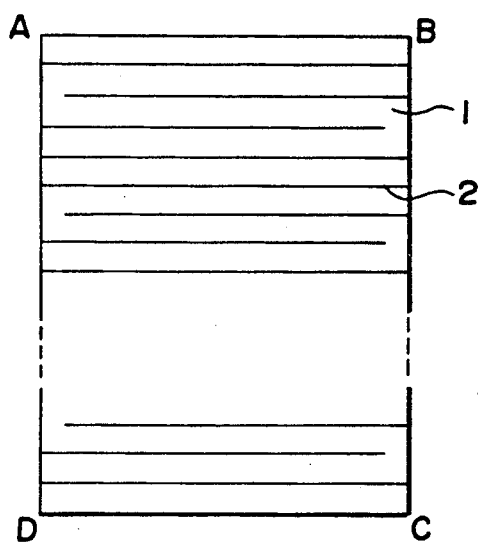
Figure 5C:
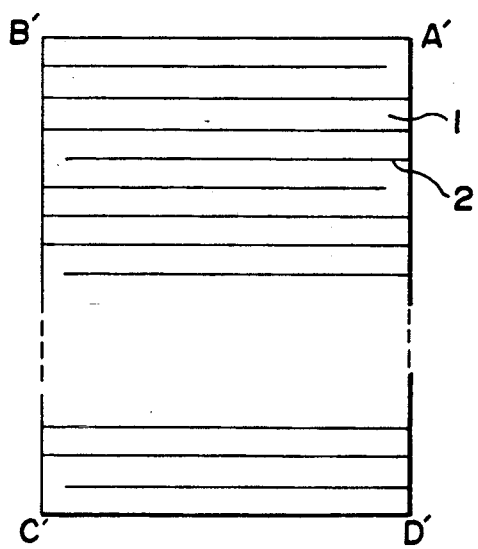
Figure 6:
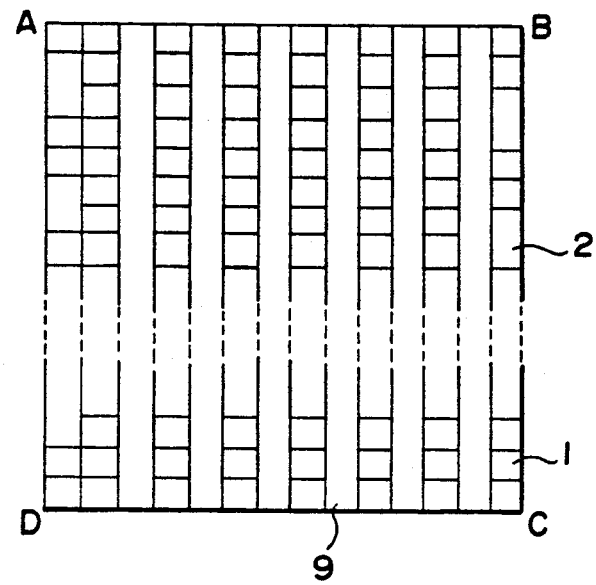

Then a protective tape was attached to the entire face A'B'C'D' as shown in FIG. 5(a) and to the face ABCD in the pattern as shown in FIG. 6 so that an insulating layer was not formed on portions other than those to be coated therewith, then the multi-layered body was immersed in a bath for electrodeposition, the temporary external electrodes were connected to a DC current source through the lead wires so that the first temporary external electrode (i.e., the temporary external electrode formed in the vicinity of the edge A'D' shown in FIG. 5(a)) served as an anode and the counter external temporary electrode served as a cathode and then electrophoresis was performed to electrodeposite alumina particles and a polyamide acid resin present in the bath on the exposed ends of the inner electrodes which were electrically connected to these temporary external electrodes (in this Example, the polyamide acid used was a product obtained by reacting 3,3'-diaminobenzophenone and 3,3',4,4'-benzophenonetetracarboxylic acid dianhydride and alumina used was AKP-30 (trade name) available from Sumitomo Chemical Company, Limited. Thereafter, the multi-layered body was withdrawn from the bath for electrodeposition, the liquid adhered was drained and the body was heated to 200° C. to convert the polyamide acid resin into a polyimide resin and to thus give an insulating layer of the first group.

According to the same operations, the second, third or fourth temporary external electrode (the temporary external electrode formed in the vicinity of the edge AD, BC or B'C' shown in FIG. 5(a)) was electrically connected to the anode of a DC current source through the lead wire to thus form an insulating layer of the second, third or fourth group. In these operations, the protective tape was changed so that the insulating layers in different groups were not superimposed one another.

Figure 7:
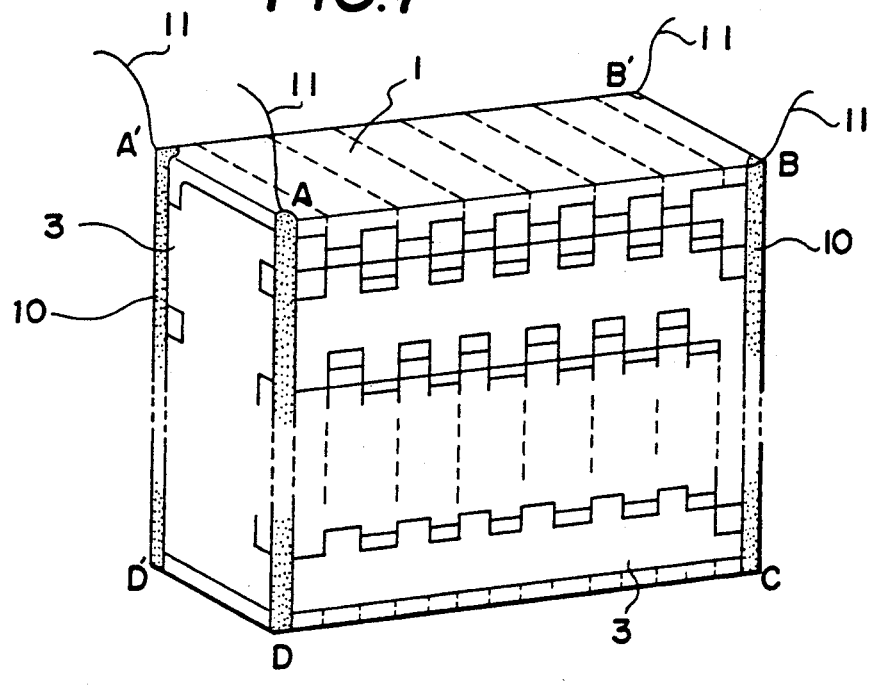
Figure 8A:
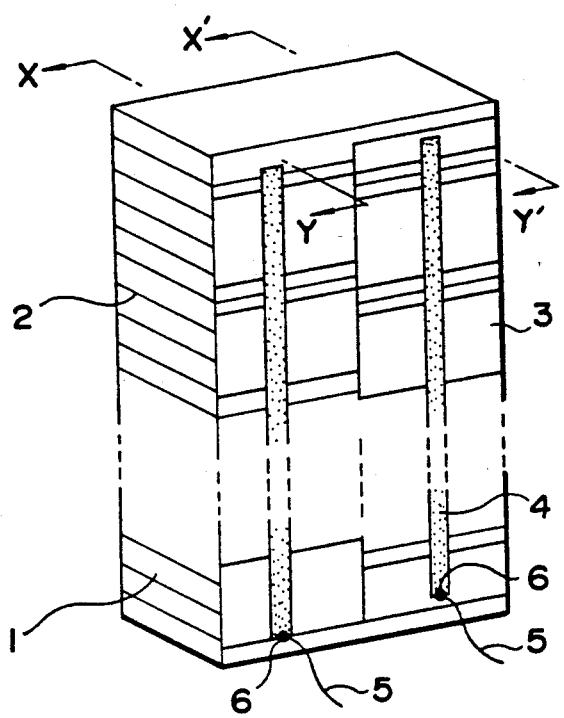
FIG. 8(a), FIG. 8(b) and FIG. 8(c) are a perspective view of a multi-layered electrostrictive effect element obtained in Example 8 and longitudinal cross sectional views taken along the lines X-Y and X'-Y' of the perspective view, respectively.
Figure 8B:
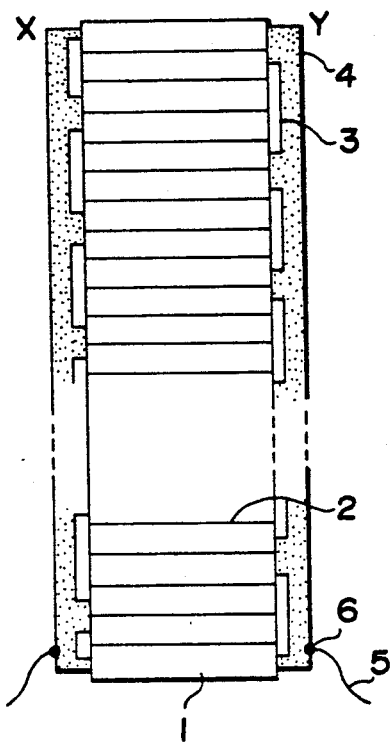
Figure 8C:
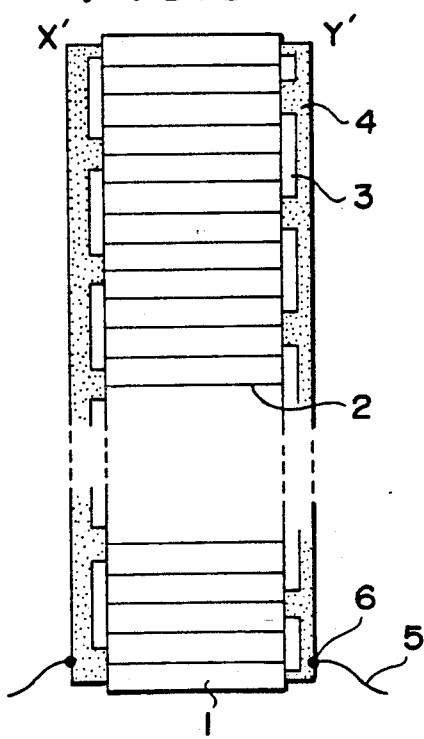

The lead wires were disconnected from the temporary external electrodes of the body on which the insulating layers were formed during the foregoing step as shown in FIG. 7 and the body was cut into individual elements each of which provided with 4 groups of insulating layers. A silver paste was applied to the individual element through the insulating layers to form external electrodes and the electrodes were connected to lead wires to thus complete the element (the element is schematically shown in FIG. 8).

The element thus obtained was connected to a power supply through lead wires so that the polarities of the neighbouring two inner electrodes were opposite to one another and the lead wires were combined two by two, a voltage of 80 V (electric field=10 KV/cm) was applied thereto. The elongation along the direction of the potential applied was determined and it was found to be about 0.10%.

EXAMPLE 9

The same procedures used in Example 8 were repeated to give small pieces of green sheets having a thickness of 0.1 mm. A platinum paste was applied to 100 sheets of these small pieces in patterns as shown in FIG. 9 as in Example 8 according to the screen printing method. All of the screen printed small pieces and a sheet free of printed patterns were put in layers in the order as shown in FIG. 10 and the multi-layered body obtained was subjected to thermocompression bonding at a temperature of 120° C. and a load of 159 Kg/cm².

Figure 11:
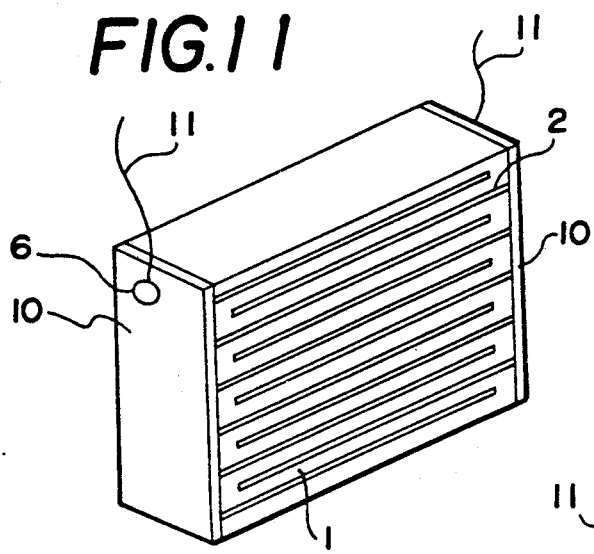

The resulting multi-layered body was degreased in the same manner used in Example 8 and then sintered. The distance between the inner electrodes of the resulting sintered body was 0.08 mm and in every second layers one inner electrode did not reach the edge of the layer on both sides of the multi-layered body. As shown in FIG. 11, a conductive paste was applied onto these two sides to form temporary external electrodes and the external electrode were electrically connected to each corresponding lead wire. Then a protective tape was adhered to one of two sides of the body on which the ends of the inner electrodes free of the temporary external electrodes were exposed and a mixture of a polyamide acid and alumina particles was electrolytically deposited on the exposed ends of the inner electrodes which were connected to the lead wires and the portions in the vicinity thereof by electrophoresis method as in Example 8 (the polyamide acid and the alumina were the same as those used in Example 8). Then, as in Example 8, the multi-layered body was withdrawn from the bath for electrophoresis, the liquid attached thereto was drained and the body was heated at 200° C. to convert the polyamide acid resin into a polyimide resin and to thus form an insulating layer of the first group. The same procedures used above were repeated using the second lead wire to form an insulating layer of the second group. At this step, the protective tape was changed so that the first insulating layer was not again insulated by the second insulating layer.

Figure 12:
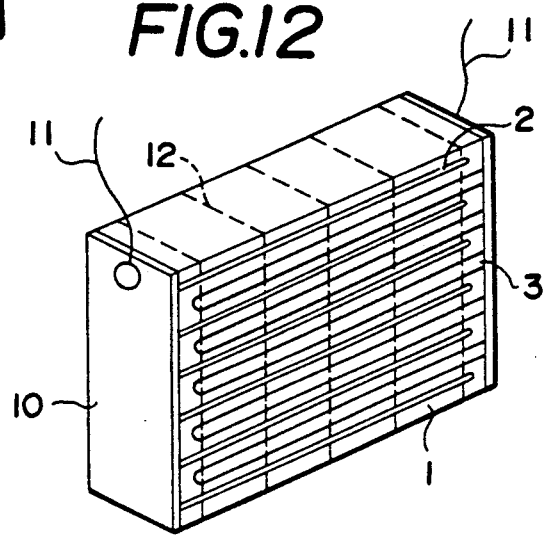
Figure 13:
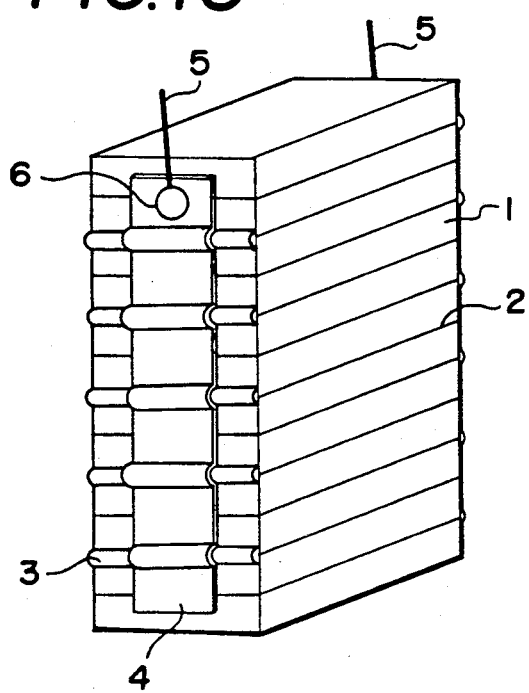
FIG. 13 is a perspective view of a multi-layered electrostrictive effect element obtained in Example 9.

The temporary external electrodes of the multi-layered body to which the insulating layers were applied in the foregoing step were disconnected from the lead wires as shown in FIG. 12 and the body was cut into a plurality of individual elements each provided with two groups of insulating layers. Finally, a silver paste was applied to the individual elements through the insulating layers to form external electrodes which were then electrically connected to lead wires to complete each element (see FIG. 13).

Two lead wires of the element thus obtained were connected to a power supply and a voltage of 80 V (electric filed=10 KV/cm) was applied to the element to determine the elongation of the element. As a result, it was found to be about 0.08%.

EXAMPLE 10

In this Example, 10 each of multi-layered electrostrictive effect elements were prepared according to two kinds of methods.

The first method was the same as that used in Example 1 (the element produced according to this method is hereinafter referred to as "element A").

Figure 14:
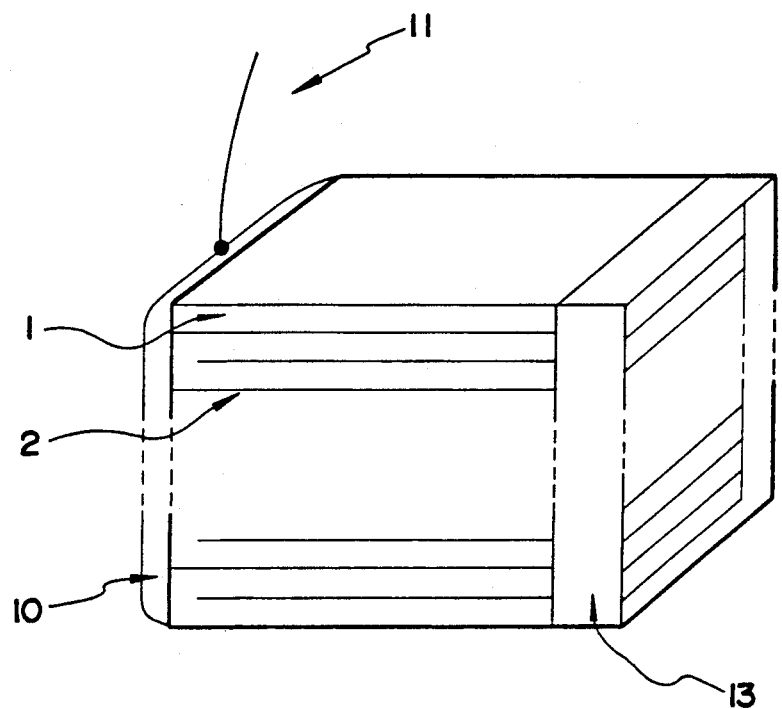
FIG. 14 is a perspective view showing an embodiment of the multi-layered electrostrictive effect element obtained in Example 10.

The second method was the same as that used in Example 1 except that, in the electrophoresis, an insulating tape was adhered to the multi-layered body so that the periphery of the side face of the multi-layered body to be coated with an insulating layer was completely surrounded as shown in FIG. 14 to thus form a framework, a voltage of 20 V was applied to perform electrophoresis for 15 seconds and then the insulating tape was peeled off (the element formed by this method is hereinafter referred to as "element B".

The elements A and B were observed with an optical microscope and as a result it was found that, in the element A, the exposed ends of the inner electrodes in the vicinity of the upper and/or lower ends of the element in the direction of the lamination were continuously insulated over not less than 3 layers in 6 elements out of 10 elements examined. On the other hand, it was observed that the insulating layers covered the exposed ends of the inner electrodes on every two layers independently in all of 10 elements examined.

EXAMPLE 11

The same procedures used in Example 8 were repeated except that, upon performing electrodeposition, the electrophoresis process was performed after adhering an insulating tape to a multi-layered body to be processed so that the periphery of the side face of the multi-layered sintered body to be coated with an insulating layer was completely surrounded to thus form a framework, then the sintered body was withdrawn from the bath for electrodeposition and the tape was peeled off, to produce an element.

The elongation of the element thus obtained was determined according to the same manner used in Example 8 and was found to be about 0.11%.

The shape of the insulating layers were observed by an optical microscope and it was found that the element obtained in this Example had the same shape as that schematically shown in FIG. 8.

As seen from the comparison of the foregoing Examples with Comparative Examples, multi-layered bodies having high dielectric strength can efficiently be produced by simultaneously using an insulating filler and a polyamide acid resin for forming an insulating layer and the method of this invention makes it possible to reduce the cost for producing electrostrictive effect elements. Moreover, according to the structure of the electrostrictive effect element of the present invention in which the exposed ends of the inner electrodes are continuously covered with an insulating layer over three layers, the insulating layer can be formed on only the desired exposed ends of the inner electrodes without covering those which are connected to the external electrodes even if the thickness of the electristrictive material is very thin. Therefore, the method of the present invention makes it possible to easily produce elements which exhibit high displacement even if the element is operated at a low voltage.

We claim:

1. A multi-layered electrostrictive effect element which comprises films or thin plates of an electrostrictive material and inner electrodes alternatively arranged in layers, the inner electrodes being formed on the entire surface of the films or thin plates of the electrostrictive material, wherein insulating layers which insulate the inner electrodes exposed on the side end faces of the element comprise m groups wherein m is an even number of not less than 4, the insulating layer which comprises the first group continuously extending over and insulating the inner electrodes other than the $(m \times n+1)$-th electrode wherein n is 0 or a positive integer, the insulating layer which comprises the second group continuously extending over and insulating the inner electrodes other than the $(m \times n+2)$-th electrode, the insulating layer which comprises the third group continuously extending over and insulating the inner electrodes other than the $(m \times n+3)$-th electrode and so forth, and the insulating layer which comprises the m-th group continuously extending over and insulating the inner electrodes other than the $(m \times n+m)$-th electrode; and a plurality of external electrodes being electrically connected to every m layers of inner electrodes laminated is formed over the insulating layer of each group.

2. The multi-layered electrostrictive effect element of claim 1 wherein the insulating layers which insulate the inner electrodes exposed on the side end faces of the element comprise 4 groups, the insulating layer which comprises the first group continuously extending over and insulating the inner electrodes other than the $(4n+1)$-th electrode (n is 0 or a positive integer), the insulating layer which comprises the second group continuously extending over and insulating the inner electrodes other than the $(4n+2)$-th electrode, the insulating layer which comprises the third group continuously extending over and insulating the inner electrodes other than the $(4n+3)$-th electrode and the insulating layer which comprises the 4-th group continuously extending over and insulating the inner electrodes other than the $(4n+4)$-th electrode; and an external electrode which is electrically connected to every 4 layers of the inner electrodes laminated is formed over the insulating layer of each group.

3. The multi-layered electrostrictive effect element of claim 1 wherein the insulating layer comprises an organic insulating material.

4. The multi-layered electrostrictive effect element of claim 3 wherein the organic material is a polyimide resin having repeating units represented by the following general formula (I):

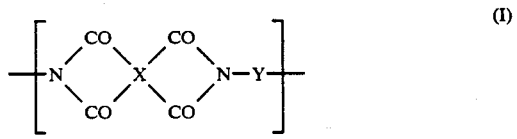

(wherein X represents a tetravalent group selected from the group consisting of tetravalent phenyl groups; tetravalent biphenyl groups; and tetravalent polyphenyl groups in which at least one of either the phenyl or biphenyl groups are bonded through at least one member selected from the group consisting of O, CO, S, $CH_2$, $C(CH_3)_2$ and $C(CF_3)_2$ and Y represents a bivalent groups selected from the group consisting of bivalent phenyl groups; bivalent biphenyl groups; bivalent polyphenyl groups in which at least one of either the phenyl or biphenyl groups are bonded through at least one member selected from the group consisting of O, CO, S, $SO_2$, $CH_2$, $C(CH_3)_2$ and $C(CF_3)_2$; alkylene groups; and xylylene groups.

5. The multi-layered electrostrictive effect element of claim 3 wherein the insulating layer comprises a polyimide resin having repeating units represented by the following general formula (I):

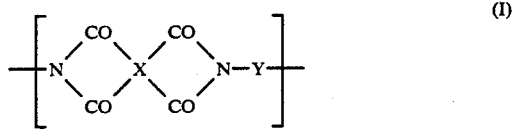

(wherein X represents a tetravalent group selected from the group consisting of tetravalent phenyl groups; tetravalent biphenyl groups; and tetravalent polyphenyl groups in which at least one of either the phenyl or biphenyl groups are bonded through at least one member selected from the group consisting of O, CO, S, $CH_2$, $C(CH_3)_2$ and $C(CF_3)_2$ and Y represents a bivalent groups selected from the group consisting of bivalent phenyl groups; bivalent biphenyl groups; bivalent polyphenyl groups in which at least one of either the phenyl or biphenyl groups are bonded through at least one member selected from the group consisting of O, CO, S, $SO_2$, $CH_2$, $C(CH_3)_2$; alkylene groups; and xyxlylene groups and an insulating filler.

6. The multi-layered electrostrictive effect element of claim 1 wherein it is a multi-layered electrostrictive vertical effect element.

* * * * *

UNITED STATES PATENT AND TRADEMARK OFFICE
CERTIFICATE OF CORRECTION

PATENT NO. : 5,173,162

DATED : December 22, 1992

INVENTOR(S) : Hagimura et al.

It is certified that error appears in the above-identified patent and that said Letters Patent is hereby corrected as shown below:

In column 24, line 1, after "$C(CH_3)_2$" insert --and $C(CF_3)_2$--.

Signed and Sealed this

Eighteenth Day of January, 1994

BRUCE LEHMAN

Attest:

*Attesting Officer*  *Commissioner of Patents and Trademarks*